United States Patent [19]
Huang

[11] Patent Number: 5,932,489
[45] Date of Patent: Aug. 3, 1999

[54] METHOD FOR MANUFACTURING PHASE-SHIFTING MASK

[75] Inventor: Chien Chao Huang, Kaohsiung, Taiwan

[73] Assignee: United Microelectronics Corp., Taiwan

[21] Appl. No.: 08/847,723

[22] Filed: Apr. 22, 1997

[30] Foreign Application Priority Data

Feb. 14, 1997 [TW] Taiwan .................................. 86101761

[51] Int. Cl.⁶ ................................ G03F 9/00; G03F 7/12
[52] U.S. Cl. ......................... 438/717; 438/942; 438/948;
430/5; 430/313; 430/315; 430/322; 430/324;
148/DIG. 106; 216/41; 216/48; 216/51
[58] Field of Search ............................. 430/5, 323, 324,
430/313, 314, 315, 317; 438/942, 948,
950, FOR 117, 717, 945; 148/DIG. 105,
DIG. 106; 216/41, 45, 48, 51

[56] References Cited

U.S. PATENT DOCUMENTS

| | | |
|---|---|---|
| 5,268,244 | 12/1993 | Yoo .............................................. 430/5 |
| 5,288,568 | 2/1994 | Cathey, Jr. .................................... 430/5 |
| 5,382,483 | 1/1995 | Young .......................................... 430/5 |
| 5,455,131 | 10/1995 | Kang et al. .................................. 430/5 |
| 5,536,606 | 7/1996 | Doan ............................................ 430/5 |
| 5,567,552 | 10/1996 | Ham ............................................. 430/5 |
| 5,591,549 | 1/1997 | Yang ............................................ 430/5 |
| 5,595,843 | 1/1997 | Dao .............................................. 430/5 |
| 5,658,695 | 8/1997 | Choi ............................................. 430/5 |

*Primary Examiner*—Mary Wilczewski
*Attorney, Agent, or Firm*—Finnegan, Henderson, Farabow, Garrett & Dunner, L.L.P.

[57] ABSTRACT

A method for manufacturing phase-shifting masks utilizing a photolithographic process and sidewall spacers to fabricate a phase-shifting layer. The method provides precise control over the shape and size of the resulting phase-shifting layer, and thus, simplifies photomask production.

8 Claims, 6 Drawing Sheets

METHOD FOR MANUFACTURING PHASE-SHIFTING MASK

BACKGROUND OF THE INVENTION

1. Field of Invention

The present invention relates generally to a photolithographic processing method, and more particularly to a photolithographic processing method for manufacturing phase-shifting masks (PSM).

2. Description of Related Art

In photolithography, optical stepper machines, using ultra-violet light as a source of illumination, transfer patterns onto a wafer layer. The pattern transfer capacity of an optical stepper depends on two important parameters, namely, the resolution and the depth of focus (DOF). The resolution of an optical stepper depends primarily on the wavelength of the light source used. To obtain a quality exposure, the resolution needs to be small while the depth of focus needs to be large. Although a lower resolution is achieved when the wavelength of the light source is small, the depth of focus is correspondingly reduced. Hence, there is a trade-off between the resolution and the depth of focus in the design of an optical stepper system.

To satisfy the requirements for the next generation of 64MB DRAMs, a light source having a shorter wavelength must be developed for photolithographic processes. An example of such a light source is a krypton fluoride laser that generates a deep ultra-violet ray. Also being developed are photolithographic processes aimed at solving the resolution and depth of focus problem shown above, without using new light sources.

A phase-shifting mask, in contrast to a conventional mask, comprises a shifting layer, through which light is positively and negatively phase-shifted to simultaneously cause interference. As a result, the image pattern projected, via the shifting layer, onto the wafer layer to be patterned by the optical stepper has an improved resolution.

FIGS. 1(a) through 1(c) show the conventional method for manufacturing a phase-shifting mask. Referring to FIG. 1(a), a photomask layer 10 acts as the main body of the mask and comprises a material having good light transparency, such as quartz. An opaque shield 12, a phase shifting layer 14 and a photoresist layer 16 are sequentially formed above photomask layer 10. Opaque shield 12 and phase-shifting layer 14 are thin film layers made from materials, such as chrome or chromium oxide. Further, by adjusting the densities of the materials making up opaque shield 12 and phase-shifting layer 14, both opaque shield 12 and phase-shifting layer 14 can have a different light-penetrating power.

Referring to FIG. 1(b), photoresist layer 16 is patterned using a conventional photolithographic process, and phase-shifting layer 14 is dry etched using, for example, a reactive ion etching (RIE) method, to form an opening 11 that exposes a portion of opaque shield 12.

As shown in FIG. 1(c), a wet etching method subsequently removes a portion of opaque shield 12 covered by phase-shifting layer 14 and the portion of opaque shield 12 exposed by opening 11, so to expose a portion of photomask layer 10. Finally, as shown in FIG. 1(d), the manufacturing process is complete upon removal of photoresist layer 16. Hence, an uncovered light passing region 13 and interference regions 15 covered by phase-shifting layer 14 are formed inside opening 11.

The feasibility of applying the conventional method of manufacturing phase-shifting masks using photolithographic techniques primarily depends on the quality of phase-shifting layer 14. Therefore, it is critical to precisely control the output dimensions of the interference regions 15. However, the conventional manufacturing method uses wet etching process to form interference regions 15 of the phase-shifting mask, making it difficult to control the size and shape of the interference regions.

SUMMARY OF THE INVENTION

It is therefore an object of the present invention to provide a manufacturing method for phase-shifting masks that permits precise control of the size and shape of the interference regions.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

To achieve the objects and in accordance with the purpose of the invention, as embodied and broadly described herein, the invention comprises a method for manufacturing phase-shifting masks, the method including the steps of: sequentially forming a phase-shifting layer and an opaque shield above a photomask substrate; etching the opaque shield to form an opening for exposing a portion of the phase-shifting layer; forming a thin film layer to cover the opaque shield and the portion of the phase-shifting layer exposed in the opening; etching the thin film layer to form sidewall spacers on sidewalls of the opaque shield inside the opening; and using the sidewall spacers as masks, etching the phase-shifting layer unprotected by the sidewall spacers, and subsequently removing the sidewall spacers.

In accordance with another aspect, the present invention comprises a method for manufacturing a phase-shifting mask, the method including the steps of: forming an opaque shield above a photomask substrate; etching the opaque shield to form an opening for exposing a portion of the photomask substrate; sequentially forming a phase-shifting layer and a thin film layer to cover the opaque shield and the exposed portion of the photomask substrate; etching the thin film layer to form sidewall spacers on sidewalls of the phase-shifting layer inside the opening; and using the sidewall spacers as masks, etching the phase-shifting layer unprotected by the sidewall spacers, and subsequently removing the sidewall spacers.

It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of this specification, illustrate embodiments of the invention and together with the description, serve to explain the principles of the invention. In the drawings.

DESCRIPTION OF THE PREFERRED EMBODIMENTS

Reference will now be made in detail to the present preferred embodiments of the invention, examples of which are illustrated in the accompanying drawings. Wherever possible, the same reference numbers will be used throughout the drawings to refer to the same or like parts.

Figure 1A:
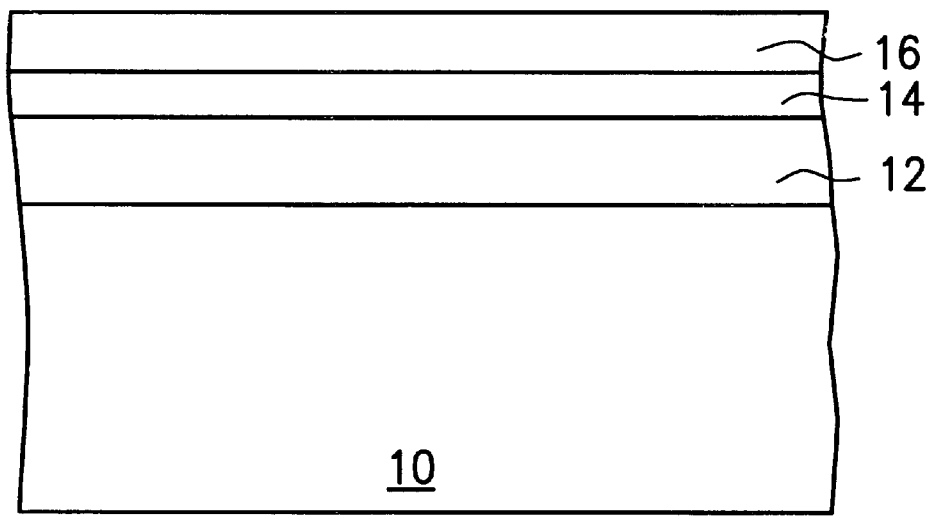
FIGS. 1(a) through 1(d) show the steps involved in a conventional method for manufacturing a phase-shifting mask.
Figure 1B:
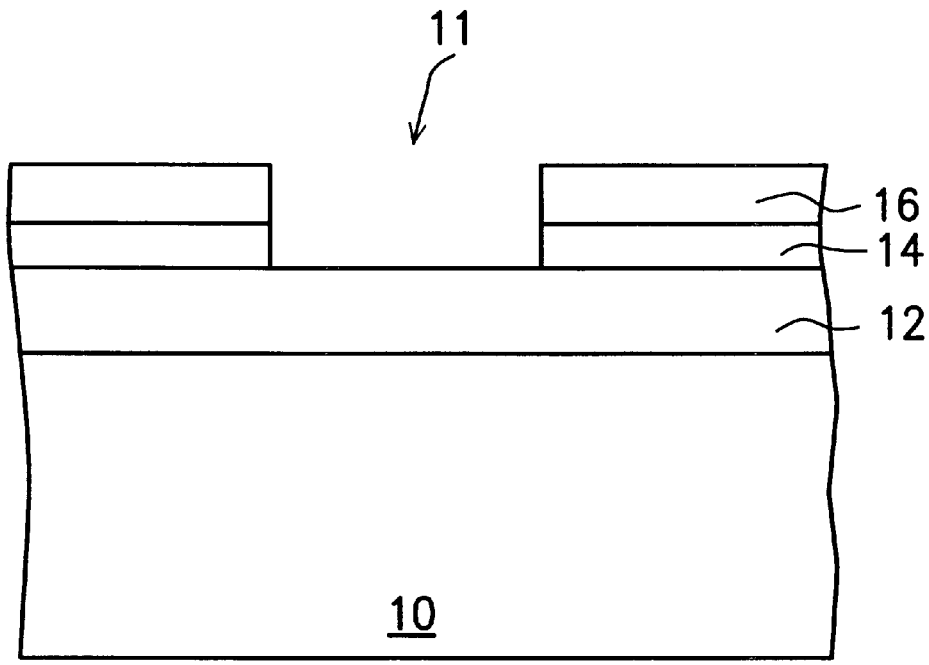
Figure 1C:
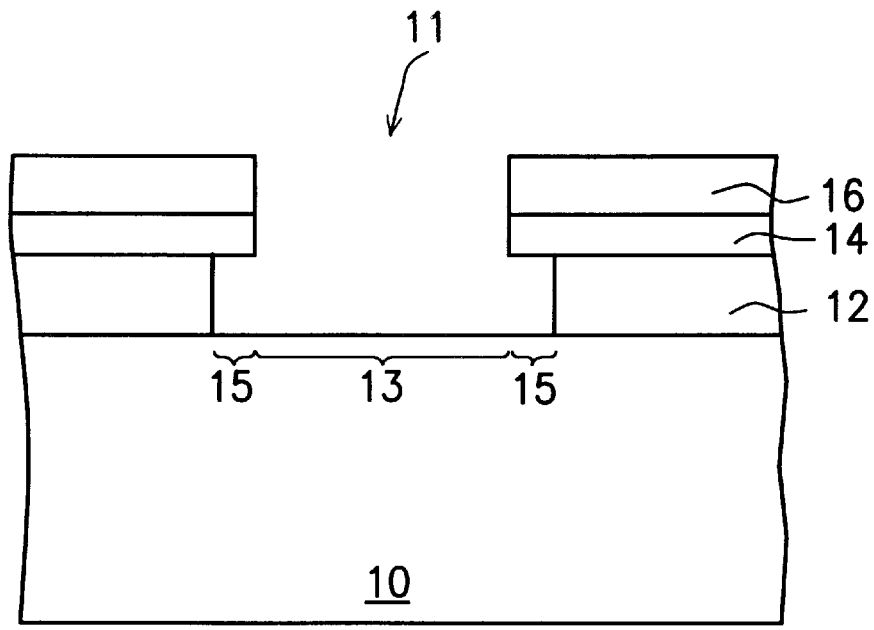
Figure 1D:
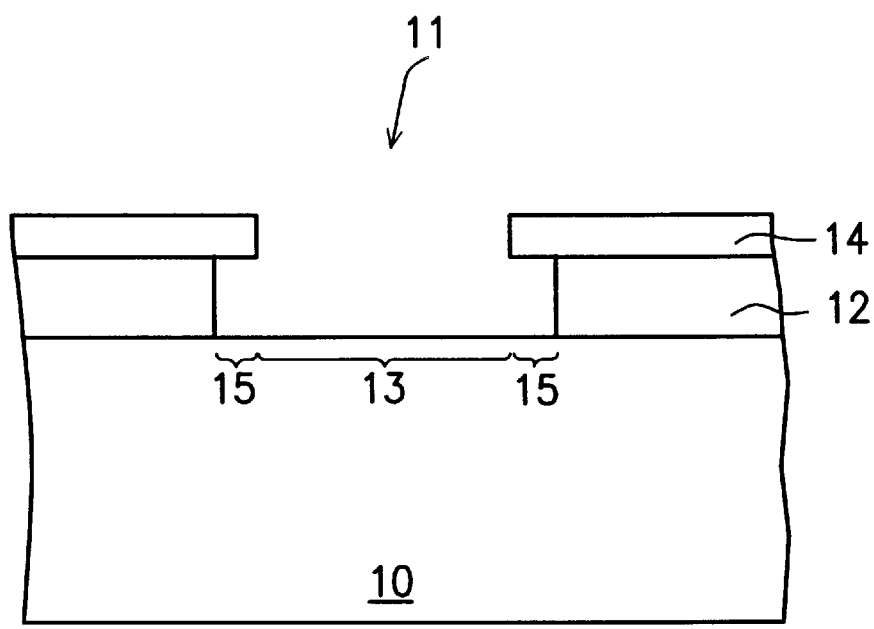
Figure 2A:
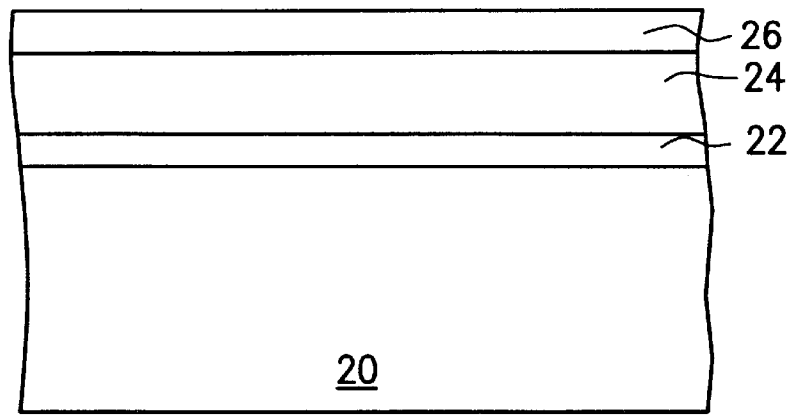
FIGS. 2(a) through 2(e) show the steps involved in a method for manufacturing a phase-shifting mask according to a first embodiment of the present invention.

Referring to FIG. 2(a), a photomask substrate 20 comprising a good light-penetrating substance, such as quartz, is used as the main body of the mask. A phase-shifting layer 22, a light-blocking opaque shield 24 and a photoresist layer 26 are sequentially formed above photomask substrate 20. Phase-shifting layer 22 and opaque shield 24 are preferably made from the same material, such as a thin film of chromium (Cr) or chromium oxide (CrO). However, the light-penetrating powers of phase-shifting layer 22 and opaque shield 24 are different since phase-shifting layer 22 and opaque shield 24 preferably have different material densities.

Figure 2B:
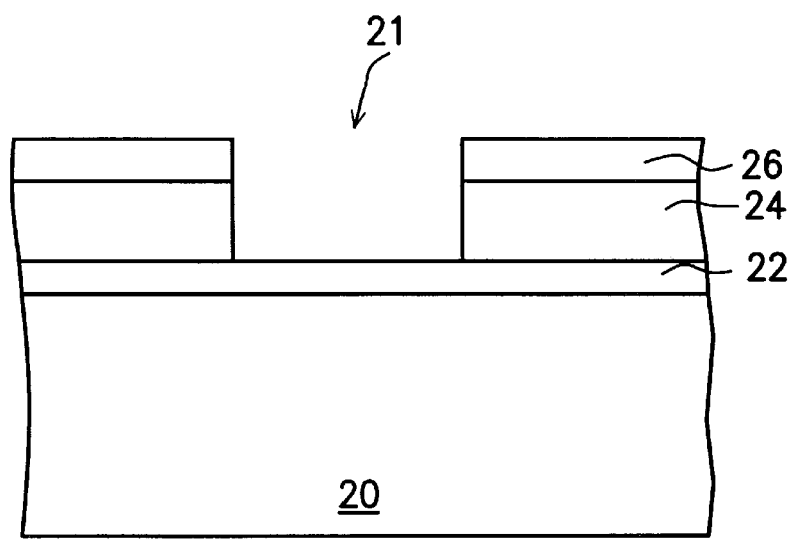
Figure 2C:
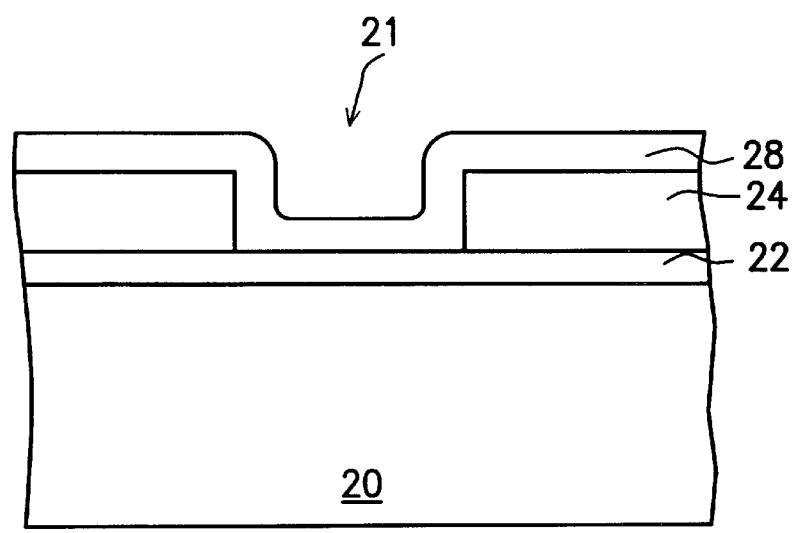

As shown in FIG. 2(b), a photolithographic process is used to pattern photoresist layer 26, and an etching operation, such as a RIE method, is then used to etch opaque shield 24 to form an opening 21 for exposing a portion of phase-shifting layer 22. Referring to FIG. 2(c), photoresist layer 26 is subsequently removed, and a thin film layer 28 preferably comprising, for example, a silicon dioxide layer, a boro-phosphosilicate glass (BPSG) layer, or a silicon nitride layer, is deposited to cover opaque shield 24 and phase-shifting layer 22 exposed in opening 21. Thin film layer 28 acts as a mask for subsequent etching of phase-shifting layer 22, and thus, its material quality as well as its thickness and size influence the subsequent production of the phase-shifting mask in this embodiment.

Figure 2D:
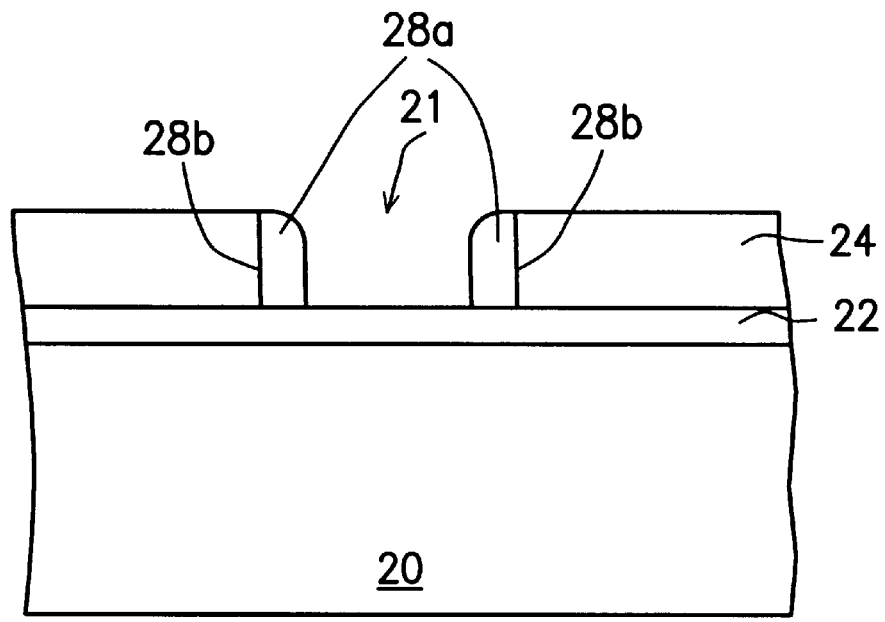
Figure 2E:
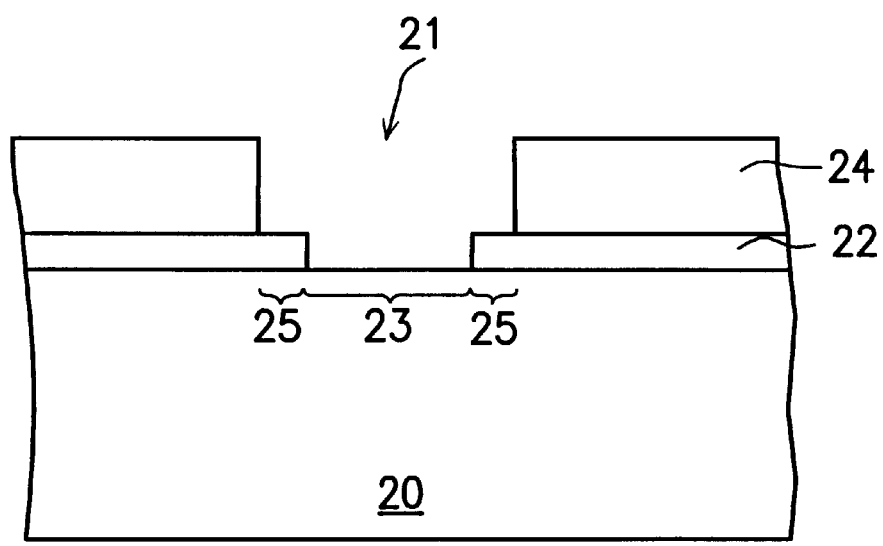

As shown in FIG. 2(d), an etching method, such as a RIE method, is used to etch thin film layer 28, so to form sidewall spacers 28a on sidewalls 28b of opaque shield 24 inside opening 21. Finally, as shown in FIG. 2(e), with sidewall spacers 28a acting as masks, a portion of phase-shifting layer 22 unprotected by sidewall spacers 28a is removed. Sidewall spacers 28a are subsequently removed, so to form an uncovered light-passing region 23 and phase-shifting layer covered interference regions 25 inside opening 21.

Figure 3A:
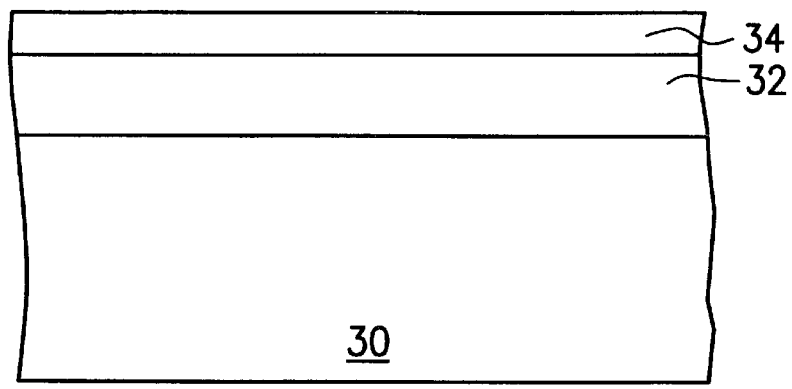
FIGS. 3(a) through 3(e) show the steps involved in a method for manufacturing a phase-shifting mask according to a second embodiment of the present invention.

The second embodiment of the method for manufacturing the phase-shifting mask in accordance with the present invention is described, with reference to FIGS. 3(a)–(e). Referring to FIG. 3(a), a photomask substrate 30 preferably comprising a good light-penetrating substance, such as quartz, is used as the main body of the mask. Thereafter, a light blocking opaque shield 32 and a photoresist layer 34 are sequentially formed above photomask substrate 30.

Figure 3B:
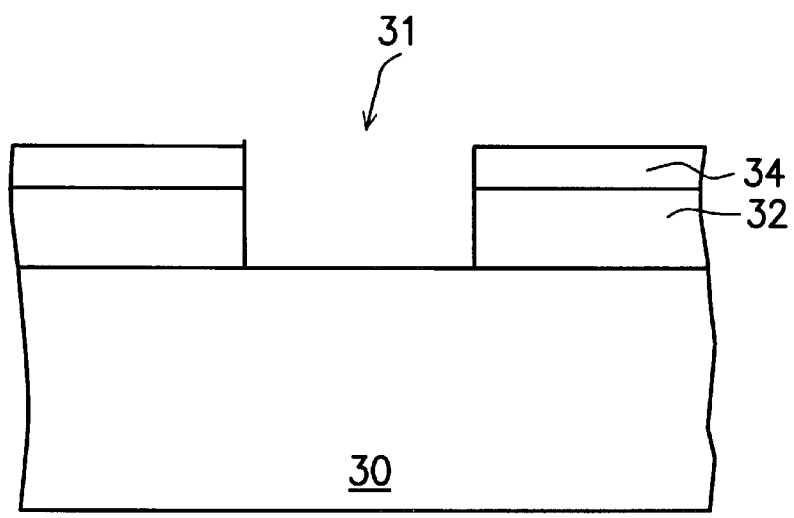

As shown in FIG. 3(b), a photolithographic process is used to pattern photoresist layer 34, and an etching operation, such as a RIE method, is then used to etch opaque shield 32, forming an opening 31 therein to expose a portion of photomask substrate 30.

Figure 3C:
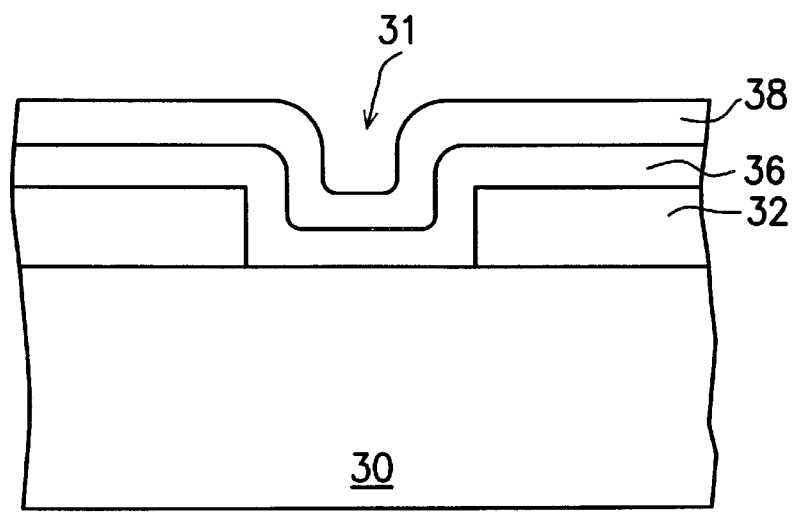

Referring to FIG. 3(c), photoresist layer 34 is subsequently removed, and a phase shifting layer 36 and a thin film layer 38 are sequentially deposited above the photomask substrate 30. Thin film layer 38 preferably comprises a silicon dioxide layer, a boro-phosphosilicate glass (BPSG) layer or a silicon nitride layer. Thin film layer 38 functions as a mask during subsequent etching of phase-shifting layer 36, and thus, its material quality as well as its thickness and size influence the production of the phase-shifting mask according to this embodiment.

Figure 3D:
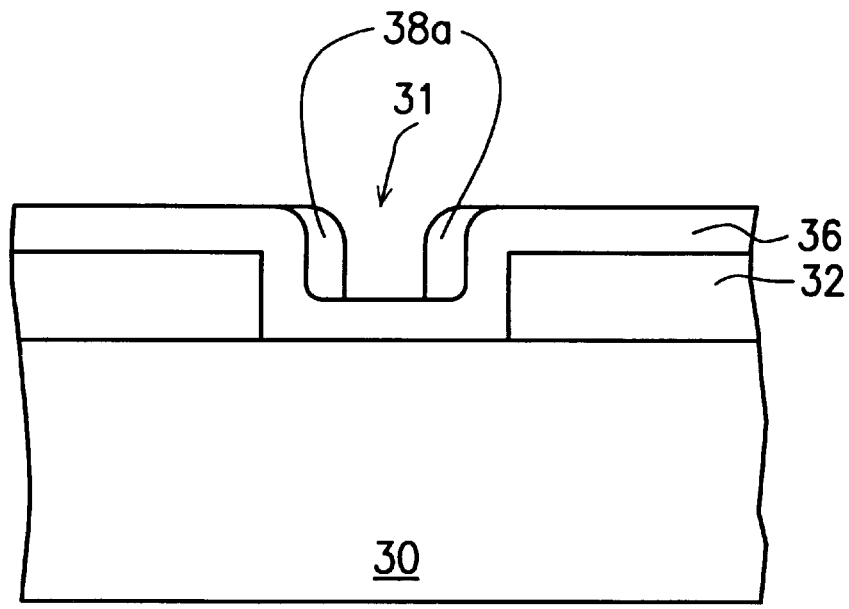
Figure 3E:
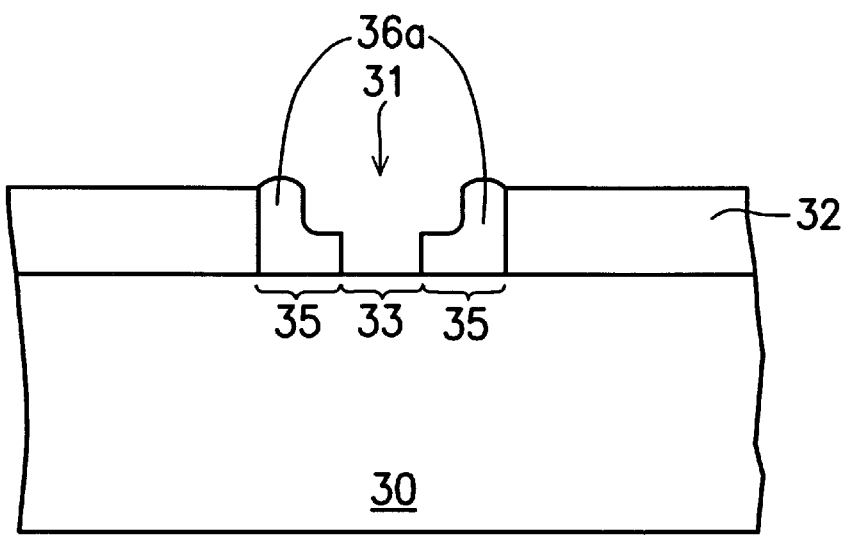

As shown in FIG. 3(d), an etching operation, such as a RIE method, is used to etch thin film layer 38 so to form sidewall spacers 38a on sidewalls 38b of phase-shifting layer 36 inside opening 31. Finally, as shown in FIG. 3(e), with sidewall spacers 38a acting as masks, the portion of phase-shifting layer 36 unprotected by sidewall spacers 38a is removed leaving only phase-shifting layer 36a. Sidewall spacers 38a are subsequently removed so to form an uncovered light-passing region 33 and phase-shifting layer covered interference regions 35 inside opening 31.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A method for manufacturing phase-shifting masks, the method comprising the steps of:

forming an opaque shield above a photomask substrate;

etching the opaque shield to form an opening therein for exposing a portion of the photomask substrate;

sequentially forming a phase-shifting layer and a thin film layer to cover the opaque shield and the portion of the photomask substrate exposed in the opening;

etching the thin film layer to form sidewall spacers on sidewalls of the phase-shifting layer inside the opening; and using the sidewall spacers as masks, etching the phase-shifting layer unprotected by the sidewall spacers, and subsequently removing the sidewall spacers.

2. A method according to claim 1, wherein the photomask substrate comprises a quartz substrate.

3. A method according to claim 1, wherein the phase-shifting layer and the opaque shield each comprise a chromium thin film.

4. A method according to claim 1, wherein the phase-shifting layer and the opaque shield each comprise a chromium oxide thin film.

5. A method according to claim 1, wherein the phase-shifting layer and the opaque shield each have a different light-penetrating power due to differences in the material densities of the phase-shifting layer and the opaque shield.

6. A method according to claim 1, wherein the thin film layer comprises a silicon dioxide layer.

7. A method according to claim 1, wherein the thin film layer comprises a boro-phosphosilicate glass layer.

8. A method according to claim 1, wherein the thin film layer comprises a silicon nitride layer.

* * * * *